United States Patent [19]
Nakajima et al.

[11] Patent Number: 5,497,117
[45] Date of Patent: Mar. 5, 1996

[54] INPUT SENSE CIRCUIT HAVING SELECTABLE THRESHOLDS

[75] Inventors: Takao Nakajima, Ebina; Kenichi Nakamura, Tokyo, both of Japan

[73] Assignee: Kabushiki Kaisha Toshiba, Kawasaki, Japan

[21] Appl. No.: 395,033

[22] Filed: Feb. 27, 1995

[30] Foreign Application Priority Data

Mar. 3, 1994 [JP] Japan ................................. 6-033575

[51] Int. Cl.$^6$ ............................................. H03K 17/687
[52] U.S. Cl. ............................... 327/404; 327/74; 327/78; 327/81; 327/391; 327/437
[58] Field of Search ................................. 327/74, 77, 78, 327/80, 81, 276, 278, 391, 403, 404, 407, 408, 415, 416, 437

[56] References Cited

U.S. PATENT DOCUMENTS

| | | | |
|---|---|---|---|
| 3,657,575 | 4/1972 | Taniguchi et al. | 327/541 |
| 3,952,213 | 4/1976 | Fukaya | 327/285 |
| 4,021,653 | 5/1977 | Sharp et al. | 327/18 |
| 4,446,390 | 5/1984 | Alaspa | 327/404 |
| 4,508,983 | 4/1985 | Allgood et al. | 327/437 |
| 4,611,135 | 9/1986 | Nakayama et al. | 327/404 |
| 4,718,063 | 1/1988 | Reedy et al. | 327/403 |
| 4,859,873 | 8/1989 | O'Shaughnessy et al. | 327/408 |
| 5,010,261 | 4/1991 | Steigerwald | 327/404 |
| 5,075,569 | 12/1991 | Branson | 327/407 |
| 5,111,072 | 5/1992 | Siedel | 327/437 |
| 5,185,540 | 2/1993 | Boudry | 327/276 |
| 5,295,174 | 3/1994 | Shimizu | 327/407 |

Primary Examiner—Terry Cunningham
Attorney, Agent, or Firm—Loeb and Loeb

[57] ABSTRACT

A semiconductor integrated circuit comprises an input signal terminal to which an input signal is supplied from an outer unit, a plurality of input voltage sensing circuits each having a different circuit threshold value and connected to the input signal terminal, for sensing whether a voltage of the input signal is higher or lower than a predetermined normal level, a power supply voltage sensing circuit for sensing whether a power supply voltage applied from another outer unit is a normal power supply voltage or a voltage different from the normal power supply voltage, a selection circuit for selecting a corresponding one from a plurality of the input voltage sensing circuits in accordance with an output of the power supply sensing circuit, and an internal circuit to which an output of a selected one of the input voltage sensing circuits is connected.

7 Claims, 2 Drawing Sheets

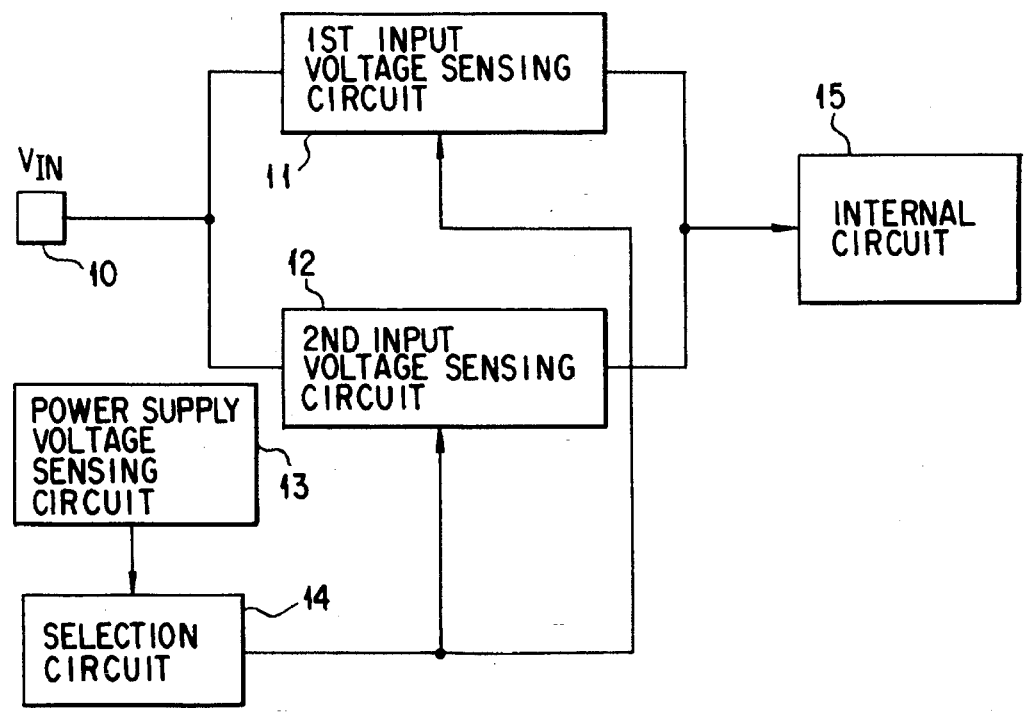
F I G. 3

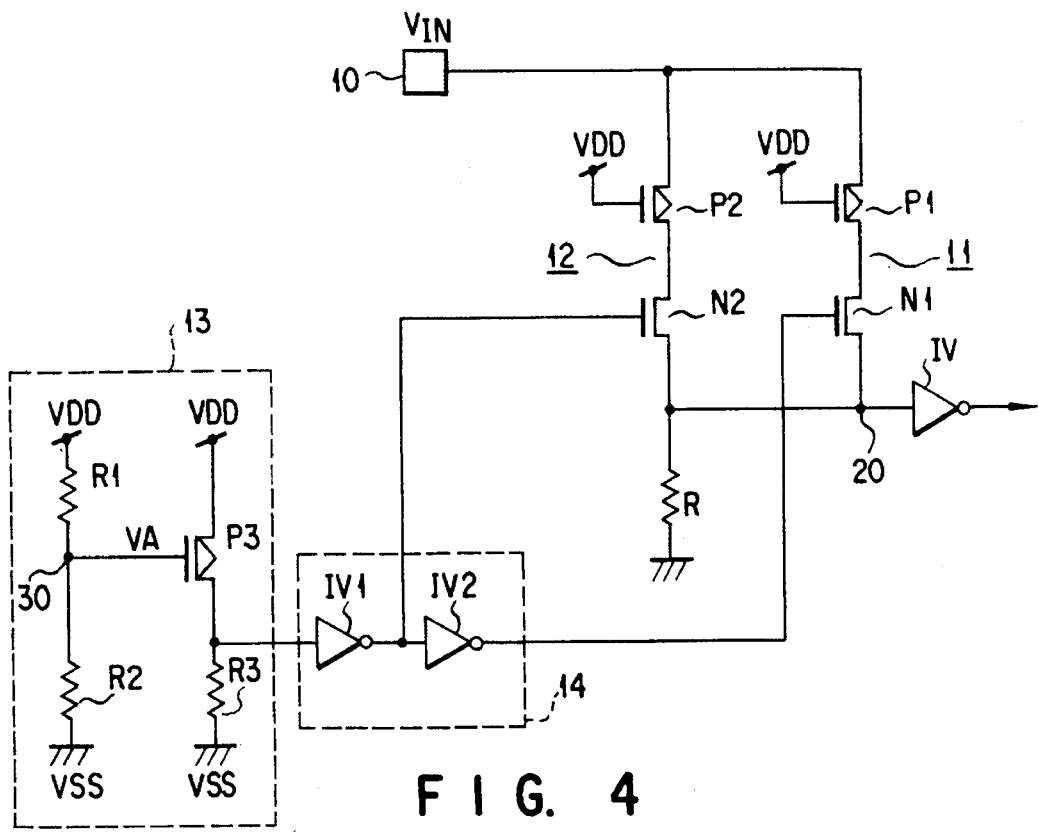
F I G. 4
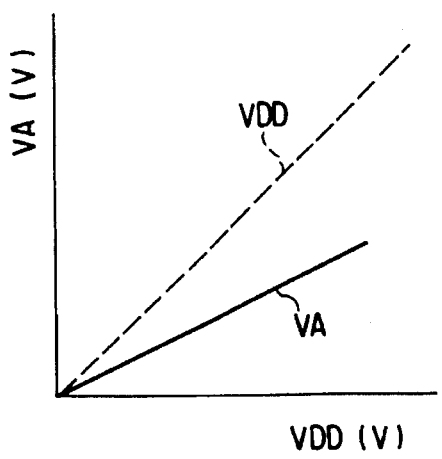
F I G. 5
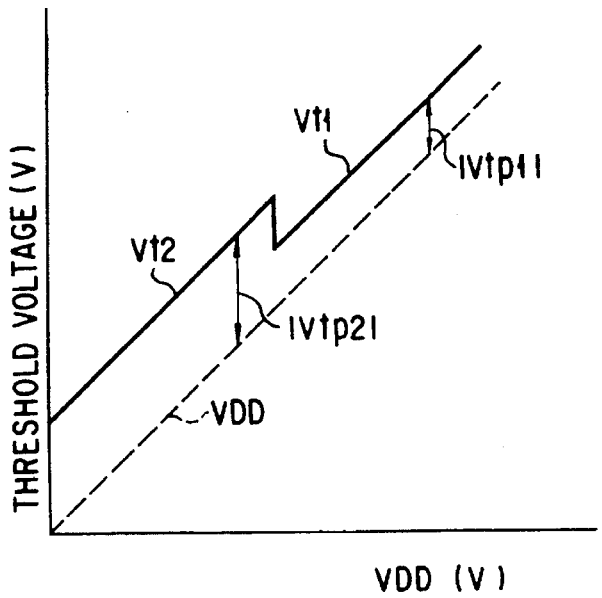
F I G. 6

INPUT SENSE CIRCUIT HAVING SELECTABLE THRESHOLDS

BACKGROUND OF THE INVENTION

1. Field of the Invention

The present invention relates to a semiconductor integrated circuit and more particularly to an input voltage sensing circuit for sensing whether a voltage of an input signal is higher or lower than a predetermined normal level.

2. Description of the Related Art

In a semiconductor integrated circuit, for example, a CMOS type semiconductor memory, an address signal or a control signal is inputted from an outer unit, and such input signals are changed between a power supply voltage VDD and a reference voltage VSS at the time when the memory is normally operated. There is a case in which the input voltage of a particular input signal is set to be higher than the voltage of the normal operation time so as to change the memory from the normal operation mode to a test mode by use of the input signal.

An input voltage sensing circuit, which is provided in the memory so as to detect whether the voltage of such an input signal is higher or lower than a predetermined normal level, is conventionally structured as shown in FIG. 1.

More specifically, an input signal terminal 10 and a source of a PMOS transistor TP are connected to each other. A drain of the PMOS transistor and one end of a resistor element R are connected to each other, and another end of the resistor element R is connected to a reference voltage VSS (ground voltage in this case). The drain of the PMOS transistor TP is also connected to an input side of an inverter IV, which is one of input portions of an internal circuit, and a gate of the PMOS transistor TP is connected to a predetermined normal voltage (e.g., power supply voltage VDD of the memory). It is noted that other ordinary input circuits (not shown) are also connected to the input signal terminal 10.

FIG. 2 shows power supply voltage VDD dependency of a circuit threshold value Vt of the above-structured input voltage sensing circuit. More specifically, the threshold voltage of the input voltage sensing circuit corresponds to the sum of an absolute value |Vtp| of a threshold value of the PMOS transistor TP and the power supply voltage VDD.

In this circuit, when the input signal is changed between the normal power supply voltage VDD and the reference voltage VSS, the PMOS transistor TP is turned off, an output signal of the inverter IV is set to be an "H" level, and the memory circuit to be connected thereafter is set to be in the normal operation mode.

On the other hand, when the input signal voltage VIN is higher than the normal voltage VDD by the absolute value |Vtp| of the threshold value of the PMOS transistor TP or more (VIN ≧ VDD +|Vtp|), the PMOS transistor TP is turned on, the output signal of the inverter IV is set to be an "L" level, and the memory circuit to be connected thereafter is set to be in the test mode.

However, the following problem is found out in the conventional input voltage sensing circuit.

In the system using memory devices, there is a case in which the power supply voltage VDD is lowered to reduce power consumption of the memory devices in standby state. At this time, there occurs a case in which the supply voltage of the input signal (provided from the outer unit of the memory) is not lowered. In this way, in the case that the source voltage of the input signal is maintained to be the power supply voltage corresponding to the state in which the memory is in the normal operation, the following problem will occur. When the voltage of the input signal is in an "H" level and becomes higher than the current lowered power supply voltage VDD, which is supplied to the input voltage sensing circuit, by the absolute value |Vtp| or more, the input voltage sensing circuit erroneously senses that the test mode is designated.

In order to solve the above problem, it can be considered that |Vtp| of the PMOS transistor of the input voltage sensing circuit is increased. However, in this case, it is needed that the voltage VINTM (VINTM ≧ VDD +|Vtp|) of the input signal, which is used to designate the test mode when the memory is normally operated (i.e., a state where the power supply voltage VDD is returned to the normal value), should be much higher than that in the case where the PMOS transistor having the normal threshold value is used, in accordance with the increase in |Vtp| of the PMOS transistor. As a result, voltage stress, which is much larger than that in the normal operation mode, is applied to an input line of the input voltage sensing circuit when the test mode is designated. As a result, there is possibility that a characteristic of a peripheral circuit will be deteriorated.

SUMMARY OF THE INVENTION

An object of the present invention is to provide a semiconductor integrated circuit having an input voltage sensing circuit which is not erroneously operated even if there is supplied an input signal having a voltage to be supplied when the integrated circuit is in the normal operation, although the power supply voltage of the integrated circuit is set at the different voltage from the normal operation.

According to the present invention, there is provided a semiconductor integrated circuit comprising an input signal terminal to which an input signal is supplied from an outer unit; a plurality of input voltage sensing circuits each having a different circuit threshold value and connected to the input signal terminal, for sensing whether a voltage of the input signal is higher or lower than a predetermined normal level; a power supply voltage sensing circuit for sensing whether a power supply voltage applied from another outer unit is a normal power supply voltage or a voltage different from the normal power supply voltage; a selection circuit for selecting a corresponding one from a plurality of the input voltage sensing circuits in accordance with an output of the power supply sensing circuit; and an internal circuit to which an output of a selected one of the input voltage sensing circuits is connected.

In other words, a plurality of input voltage sensing circuits are selectively used in accordance with the sensed output of the power supply voltage sensing circuit for sensing whether the power supply voltage VDD of the integrated circuit is in the normal power supply voltage state or the state different from the normal power supply voltage state. In this case, if the power supply voltage becomes lower than the normal power supply voltage because the internal circuit is in a standby state, an input voltage sensing circuit having a higher circuit threshold voltage than that of the input voltage sensing circuit which is used in the normal power supply voltage state can be automatically selected. Thereby, even if the input signal, which has a voltage to be supplied when the integrated circuit is in the normal operation, is supplied, the input voltage sensing circuit is not erroneously operated. Moreover, if the power supply voltage becomes higher than the normal power supply voltage because the internal circuit is in a standby state, the input voltage sensing circuit having a lower circuit threshold voltage than that of the input voltage sensing circuit which is used in the normal power supply voltage state can be automatically selected. Thereby, even if the input signal, which has a voltage to be supplied when the integrated circuit is in the normal operation, is supplied, the input voltage sensing circuit is not erroneously operated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a block diagram showing an input voltage sensing circuit of a semiconductor integrated circuit of one embodiment of the present invention;

FIG. 4 is a circuit diagram showing a specific example of each of the input voltage sensing circuit, the power supply voltage sensing circuit and the selection circuit of FIG. 3;

FIG. 5 is a characteristic plot showing power supply voltage (VDD) dependency of a detected output (VA) of the power supply voltage sensing circuit 13 of FIG. 4; and FIG. 6 is a characteristic plot showing power supply voltage dependency of a circuit threshold value of the input voltage sensing circuit of FIG. 4.

DETAILED DESCRIPTION OF THE PREFERRED EMBODIMENT

Figure 1:
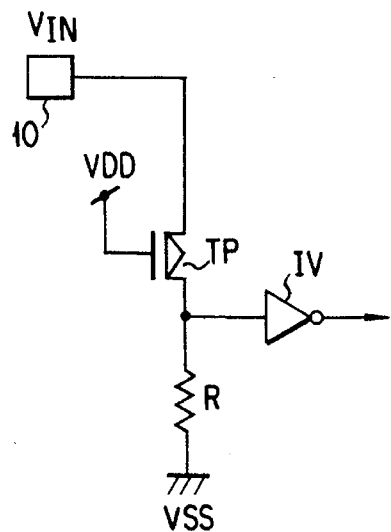
FIG. 1 is a circuit diagram showing an input voltage sensing circuit of a conventional semiconductor integrated circuit.
Figure 2:
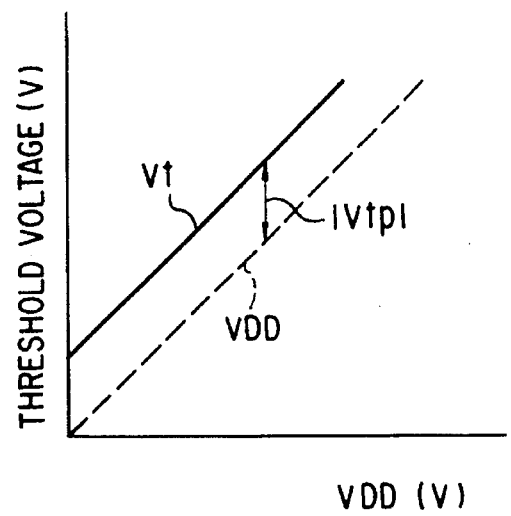
FIG. 2 is a characteristic plot showing power supply voltage dependency of a circuit threshold value in the input voltage sensing circuit of FIG. 1.

The present invention will be explained in detail with reference to the drawings.

FIG. 3 shows an input voltage sensing circuit of a semiconductor integrated circuit of one embodiment of the present invention. In the figure, reference numeral 10 is an input signal terminal to which an input signal is supplied. Reference numerals 11 and 12 denote a plurality of input voltage sensing circuits (two circuits in this embodiment). Each of the plurality of input voltage sensing circuits is provided to sense whether a voltage of the input signal of the input signal terminal 10 is higher or lower than a predetermined normal level. Also, each of the input voltage sensing circuit has a different circuit threshold value. In this embodiment, the circuit threshold value vt2 of the second input voltage sensing circuit 12 is set to be higher than the circuit threshold value Vt1 of the second input voltage sensing circuit 11.

Reference numeral 13 is a power supply voltage sensing circuit for sensing whether a power supply voltage VDD of the integrated circuit is in a normal power supply voltage state or a state different from the normal power supply voltage state. Reference numeral 14 is a selection circuit for selectively controlling two input voltage sensing circuits 11 and 12 to be a using state in accordance with an output of the power supply voltage sensing circuit 13. Reference numeral 15 is an internal circuit such as a memory circuit to which an output of the first input voltage sensing circuit 11 and an output of the second input voltage sensing circuit 12 are connected. It is noted that other ordinary input circuits (not shown) are also connected to the input signal terminal 10.

In the above-structured circuit of FIG. 3, two input voltage sensing circuits 11 and 12 are selectively used in accordance with the output of the power supply voltage sensing circuit 13 which is provided for sensing whether the power supply voltage VDD of the integrated circuit is in the normal power supply voltage state or the state different from the normal power supply voltage state. In a case where the first input voltage sensing circuit 11 is used when the power supply voltage VDD of the integrated circuit is in the normal power supply voltage state, the circuit threshold value of the first input voltage sensing circuit 11 is set to a suitable value. Then, if the power supply voltage VDD becomes lower than the normal power supply voltage in a standby state of the integrated circuit, the second input voltage sensing circuit 12 whose circuit threshold value is set to be higher than the first input voltage sensing circuit is automatically selected. Thereby, even if the voltage of the input signal, which is maintained to be the voltage corresponding to the state where the integrated circuit is set to be in the normal operation, is supplied, there is not generated an erroneous operation in which the integrated circuit is erroneously set to be in the test mode.

FIG. 4 shows a specific example of each of the input voltage sensing circuits 11 and 12 of FIG. 3, the power supply voltage sensing circuit 13, and the selection circuit 14. In the figure, a source of a first PMOS transistor P1 is connected to the input signal terminal 10, and its drain is connected to a drain of a first NMOS transistor N1 provided as a switching element. The power supply voltage VDD of the integrated circuit is applied to a gate of the first NMOS transistor N1, and the first PMOS transistor P1 has a first gate threshold voltage |Vtp1|. The source of the first NMOS transistor N1 is connected to one end of a resistor element R and an inverter IV, which is corresponding to an input portion of the internal circuit, via an input voltage sensing output node 20. The other end of the resistor element R is connected to a reference voltage (ground voltage in this embodiment). The first PMOS transistor P1, the first NMOS transistor N1, and the resistor element R constitute the first input voltage sensing circuit 11.

A source of a second PMOS transistor P2 is connected to the input signal terminal 10, and its drain is connected to a drain of a second NMOS transistor N2 provided as a switching element. A source of the second NMOS transistor N2 is connected to one end of the resistor element R which is not grounded and the input side of the inverter IV via the input voltage sensing output node 20. The power supply voltage VDD of the integrated circuit is applied to a gate of the second PMOS transistor, and the second PMOS transistor has a second gate threshold voltage |Vtp2|. The second gate threshold voltage |Vtp2| is set to be higher than the first gate threshold voltage |Vtp1|(|Vtp2|>|Vtp1|). The second PMOS transistor P2, the second NMOS transistor N2 and the resistor element R constitute the second input voltage sensing circuit 12. It is noted that the resistor element R is used in common by two input voltage sensing circuits 11 and 12.

The power supply voltage sensing circuit 13 of FIG. 4 comprises two resistor elements R1 and R2 for a voltage division, which are connected in series between a power supply voltage VDD and a ground voltage VSS, and a PMOS transistor P3 and a resistor element R3, which are connected in series between the power supply voltage VDD and a reference voltage node VSS. A gate of the PMOS transistor P3 is connected to a connection node 30 between the resistor elements R1 and R2.

The selection circuit 14 of FIG. 4 comprises the two-step connected inverters IV1 and IV2, which receive a power supply voltage sensing output obtained in a connection node between a drain of the PMOS transistor P3 of the power supply voltage sensing circuit 13 and one end of the resistor element R3 which is not grounded. The selection circuit 14 generates a complementary switch control signal for selectively controlling the first NMOS transistor N1 or the second NMOS transistor N2 to be turned on in accordance with the output of the power supply voltage sensing circuit 13.

The following will explain an operation of the above-explained circuit of FIG. 4.

A divided voltage VA of a serial-connection node 30 of two resistor elements R1 and R2 of the power supply voltage sensing circuit 13 is equal to VDD×R2/(R1+R2), and has power supply voltage VDD dependency as shown in FIG. 5. By use of this power supply voltage VDD dependency, in the case that the power supply voltage VDD is in the normal voltage state, the potential difference between the power supply voltage VDD and the divided voltage VA is set to more than the absolute value |Vtp| of the threshold voltage of the PMOS transistor P3, the PMOS transistor P3 is turned on, and the power supply voltage sensing output is set to "H" level.

On the other hand, in a case that the power supply voltage VDD is set to be lower than the normal power supply voltage in a standby state of the integrated circuit, the potential difference between the power supply voltage VDD and the divided voltage VA is set to below the absolute value |Vtp| of the threshold voltage of the PMOS transistor P3, the PMOS transistor P3 is turned off, and the power supply voltage sensing output is set to |L| level.

Therefore, in the case that the power supply voltage VDD is in the normal voltage state, the outputs of the inverters IV1 and IV2 of the selection circuit 14 are set to "L", and "H" level, respectively. Then, it is controlled that the first and second NMOS transistors N1 and N2 are turned on/off, respectively. Therefore, the first input voltage sensing circuit 11 is controlled to be in an operation enable state, and the second input voltage sensing circuit 12 is to be in an operation disable state.

On the other hand, in the case that the power supply voltage VDD is set to be lower than the normal voltage, the outputs of the inverters IV1 and IV2 of the selection circuits 14 are set to "H", and "L" level, respectively. Then, it is controlled that the first and second NMOS transistors N1 and N2 are turned off/on, respectively. Therefore, the first input voltage sensing circuit 11 is controlled to to be in the operation disable state, and the second input voltage sensing circuit 12 is to be in the operation enable state.

FIG. 6 shows power supply voltage VDD dependency of the circuit threshold values Vt1 and Vt2 of the input voltage sensing circuit section of FIG. 4.

More specifically, according to the circuit of FIG. 4, the first NMOS transistor N1 and the second NMOS transistor N2 are selectively turned on in accordance with the output of the power supply voltage sensing circuit, which senses whether the power power supply voltage VDD of the integrated circuit is in the normal voltage state or the standby state. Thereby, the first and second input voltage sensing circuits 11 and 12 are selectively controlled to be in the operation enable state.

In this case, when the power supply voltage VDD is lowered, the input voltage sensing circuit 12 having a higher circuit threshold voltage is automatically selected. Due to this, even if the input signal, which is maintained to correspond to the state where integrated circuit is in the normal power supply voltage state, is supplied thereto, the second PMOS transistor is not set to be on state, and the output of the inverter IV is not inverted.

In addition, in accordance with the above-mentioned embodiment, it is possible to structure the device in which it is detected whether the power supply voltage VDD of the integrated circuit is in the normal voltage state or the higher voltage state so that the input voltage sensing circuit having a lower circuit threshold voltage than that of the case of the normal power supply voltage state can be automatically selected when the power supply voltage state is in the higher voltage state. Thereby, even if the input signal, which is maintained to correspond to the state where integrated circuit is in the normal power supply voltage state, is supplied, the input voltage sensing circuit is not erroneously operated. If it is necessary to set the voltage of the input signal is set to be higher than the power supply voltage VDD in order that the integrated circuit is set to be a certain operation state, the input voltage sensing circuit having a lower circuit threshold voltage than that of the case of the normal power supply voltage state can be selected even if the power supply voltage VDD is higher than the normal voltage. Therefore, since the voltage of the input signal can be set to be lower than that of the case where the circuit threshold value of the input voltage sensing circuit is maintained to be high, voltage stress, which is added to the input voltage sensing circuit, can be reduced.

As mentioned above, according to the present invention, there can be realized a semiconductor integrated circuit having an input voltage sensing circuit, which is not erroneously operated even if the input signal, which is maintained to correspond to the state where integrated circuit is in the normal power supply voltage state, is supplied when the the power supply voltage of the integrated circuit is in the state different from the normal power supply voltage.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:
   an input signal terminal to which an input signal is supplied from an outer unit;
   a plurality of input voltage sensing circuits, each having a different circuit threshold value and connected to said input signal terminal, for sensing whether a voltage of said input signal is higher or lower than the respective threshold value;
   a power supply voltage sensing circuit for sensing whether a power supply voltage applied from outer unit is higher or lower than a predetermined power supply level;
   a selection circuit for selecting a corresponding one from a plurality of said input voltage sensing circuits in accordance with an output of said power supply sensing circuit; and an internal circuit to which an output of a selected one of said input voltage sensing circuits is connected.

2. The semiconductor integrated circuit according to claim 1, wherein said input voltage sensing circuits include a first input voltage sensing circuit having a first circuit threshold value and a second input voltage sensing circuit having a second circuit threshold value lower than said first circuit threshold value; and wherein said selection circuit selects said first input voltage sensing circuit when said power supply voltage sensing circuit senses that said power supply voltage is lower than the predetermined power supply level.

3. The semiconductor integrated circuit according to claim 1, wherein said input voltage sensing circuits include a first input voltage sensing circuit having a first circuit threshold value and a second input voltage sensing circuit having a second circuit threshold value lower than said first circuit threshold value; and wherein said selection circuit selects said second input voltage sensing circuit when said power supply voltage sensing circuit senses that said power supply voltage is higher than the predetermined power supply level.

4. A semiconductor integrated circuit comprising:

an input signal terminal to which an input signal is supplied from an outer unit;

a first and a second input voltage sensing circuits each having a different circuit threshold value and connected to said input signal terminal, for sensing whether a voltage of said input signal is higher or lower than a predetermined normal level;

a power supply voltage sensing circuit for sensing whether a power supply voltage applied from outer unit is a normal power supply voltage or a voltage different from said normal power supply voltage;

a selection circuit for selecting a corresponding one from said first and said second input voltage sensing circuits in accordance with the output of said power supply sensing circuit; and an internal circuit to which an output of a selected one of said input voltage sensing circuits is connected, wherein said first input voltage sensing circuit comprises a first PMOS transistor having a source to which said input signal terminal is connected, a gate to which said power supply voltage is applied and a first gate threshold voltage, a first switching circuit connected between a drain of said first PMOS transistor and an input terminal of said internal circuit, and a resistor element connected between the input terminal of said internal circuit and a reference voltage;

said second input voltage sensing circuit comprises a second PMOS transistor having a source to which said input signal terminal is connected, a gate to which said power supply voltage is applied and a second gate threshold voltage, a second switching circuit connected between a drain of said second PMOS transistor and an input terminal of said internal circuit; and said selection circuit is a switch controlling circuit for controlling said first and said second switching circuits to be selectively turned on and off in accordance with the output of said power supply voltage sensing circuit.

5. The semiconductor integrated circuit according to claim 4, wherein said power supply voltage sensing circuit comprises a PMOS transistor having a source connected to said power supply voltage a gate connected to said power supply voltage through a first resistor element and connected to said reference voltage through a second resistor element and a drain connected to an output terminal to which said selection circuit is connected; and a third resistor element connected between said output terminal and said reference voltage.

6. The semiconductor integrated circuit according to claim 5, wherein said selection circuit comprises a first inverter and a second inverter connected in series, an output terminal of said first inverter is connected to an input terminal of said second inverter, an output terminal of said power supply voltage sensing circuit to an input terminal of said first inverter, and the output terminal of said first inverter and an output terminal of said second inverter are selectively connected to one of said first switching circuit and said second switching circuit.

7. The semiconductor integrated circuit according to claim 6, wherein said first and second switching circuits respectively comprise a first and a second NMOS transistor, a drain of said first NMOS transistor is connected to the drain of said first PMOS transistor, a source of said first NMOS transistor is connected to the input terminal of said internal circuit, a drain of said second NMOS transistor is connected to the drain of said PMOS transistor, a source of said second NMOS transistor is connected to the input terminal of said internal circuit, the output terminal of said first inverter is connected to a gate of said second NMOS transistor, and the output terminal of said second inverter is connected to a gate of said first NMOS transistor.

* * * * *